US007336477B2

(12) United States Patent
Weister et al.

(10) Patent No.: US 7,336,477 B2
(45) Date of Patent: Feb. 26, 2008

(54) ELECTRICAL SWITCHING APPARATUS AND HEAT SINK THEREFOR

(75) Inventors: Nathan J. Weister, Darlington, PA (US); George A. Smith, N. Huntingdon, PA (US); Frank K. Ostrowski, Natrona Heights, PA (US); Lawrence J. Kapples, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 180 days.

(21) Appl. No.: 11/208,698

(22) Filed: Aug. 22, 2005

(65) Prior Publication Data

US 2007/0041148 A1 Feb. 22, 2007

(51) Int. Cl.
*H05K 7/20* (2006.01)
*H02B 1/56* (2006.01)
*F28D 15/00* (2006.01)

(52) U.S. Cl. ...................... 361/676; 361/678; 361/704; 361/709; 361/710; 174/16.3; 165/104.33; 165/185

(58) Field of Classification Search ........ 361/676–678, 361/601, 605, 627–631, 652, 704, 709–710; 165/80.3, 104.33, 185; 174/16.3
See application file for complete search history.

(56) References Cited

U.S. PATENT DOCUMENTS 3,810,063 A * 5/1974 Blewitt ....................... 337/166
3,959,753 A * 5/1976 Wafer .......................... 335/16
4,261,333 A 4/1981 Guarnaschelli
4,570,144 A 2/1986 Bridges et al.
4,650,939 A * 3/1987 Milianowicz ............... 218/118
5,322,982 A 6/1994 Leger et al.
5,598,322 A * 1/1997 Von Arx et al. ............ 361/704
5,753,875 A 5/1998 Benke et al.
6,018,455 A 1/2000 Wilkie, II et al.
6,388,867 B1 5/2002 Rakus et al.
6,510,047 B2 1/2003 Meiners et al.
6,762,389 B1 * 7/2004 Crooks et al. .............. 218/157
6,786,749 B2 * 9/2004 Meiners et al. ............. 439/213
6,934,156 B2 * 8/2005 Canova et al. .............. 361/704

* cited by examiner

*Primary Examiner*—Jayprakash Gandhi
*Assistant Examiner*—Robert J Hoffberg
(74) *Attorney, Agent, or Firm*—Martin J Moran

(57) ABSTRACT

A heat sink is for an integrally fused low-voltage power air circuit breaker including a line terminal and electrical bus work coupled to a current limiter. The line terminal, electrical bus work, and current limiter contribute to the formation of a thermal dam. The heat sink includes a heat exchanger structured to be coupled to the line terminal at or about the current limiter in order to expel heat from the thermal dam. The heat exchanger comprises at least one conductive member having a first end, a second end, and a plurality of bends therebetween. The heat exchanger includes heat reduction features, such as, for example, two conductive members having a number of air gaps therebetween to facilitate heat convection, a dark coating to expel heat, materials having a high thermal conductivity, and surface-enlarging mechanisms such as fins, flanges and apertures.

16 Claims, 3 Drawing Sheets

ELECTRICAL SWITCHING APPARATUS AND HEAT SINK THEREFOR

BACKGROUND OF THE INVENTION

1. Field of the Invention

The present invention relates generally to electrical switching apparatus and, more particularly, to circuit breakers including a heat sink. The invention also relates to a heat sink for dissipating heat from an electrical switching apparatus, such as a circuit breaker.

2. Background Information

In operation, electrical switching apparatus (e.g., without limitation, circuit switching devices and circuit interrupters such as circuit breakers, contactors, motor starters, motor controllers and other load controllers) used in power distribution systems often generate significant heat. When such heat becomes excessive, undesirable side effects can occur, such as, for example, damage to electrical equipment. In an attempt to avoid this and other disadvantageous consequences, industry guidelines have been developed to define acceptable thermal profiles and temperature ranges at various locations on a particular electrical switching apparatus.

Low voltage power circuit breakers, for example, are subject to such thermal profiles. Generally, low voltage power circuit breakers, such as integrally fused, low-voltage power air circuit breakers, are designed for use in low voltage applications ranging in nominal voltage up to 600 VAC. Such circuit breakers can be relatively large and, therefore, are typically configured in a draw-out arrangement in which the circuit breaker is mounted on a movable frame or cassette that can be drawn out of a housing assembly in order to, for example, gain access to the electrical terminals and bus work on the back side of the circuit breaker.

Some low voltage power circuit breakers include integrally mounted current limiters. In general, a current limiter is connected in series to a standard frame low-voltage power circuit breaker in order to safely extend the maximum interrupting rating of the coordinated, series combination to a much higher value than would otherwise be available on the standard frame. Such current limiters are typically series connected to the line terminals of the low-voltage power air circuit breakers. When the low-voltage power air circuit breaker is used in conjunction with such limiters at relatively high continuous currents (e.g., without limitation, up to 5000 amperes), a thermal dam is frequently created at the line side terminals of the breaker by, for example, the current limiters, electrical bus work, and the various electrical connections at the terminals. The thermal dam can generate excessive heat which has a tendency to reflect back into the circuit breaker and can cause damage to the circuit breaker and associated electrical equipment. Additionally, industry regulations explicitly require the temperature at the location of the line bussing coming out of the low-voltage, power air circuit breaker to be below a certain temperature threshold. The aforementioned thermal dam can result in the circuit breaker failing to meet the industry maximum temperature rise requirement for this location, thus rendering the circuit breaker unsuitable for commercial applications. Accordingly, it is desirable to eliminate thermal dams or, at a minimum, to reduce temperatures of locations known to form a thermal dam.

There is a need, therefore, to expel heat from thermal dams present in circuit breakers.

There is, therefore, room for improvement in electrical switching apparatus such as circuit breakers.

SUMMARY OF THE INVENTION

These needs and others are met by the present invention, which is directed to a heat sink for removing excess heat from an electrical switching apparatus at locations having a tendency to create a thermal dam.

As one aspect of the invention, a heat sink is provided for an electrical switching apparatus including electrical bus work and a current limiting element. The electrical switching apparatus further includes a line side with at least one line terminal, a load side with at least one load terminal, separable contacts electrically connected in series between the line terminal and the load terminal, and a housing enclosing the separable contacts. The line terminal is accessible from the exterior of the housing, and the current limiting element is coupled to the line terminal. The electrical bus work, the current limiting element, and the line terminal of the electrical switching apparatus tend to contribute to the formation of a thermal dam. The heat sink comprises: a heat exchanger structured to be coupled to the line terminal at or about the current limiting element, wherein the heat exchanger is structured to expel heat from the thermal dam in order to reduce the temperature thereof.

The heat exchanger may comprise at least one conductive member having a first end, a second end, and a plurality of bends therebetween. The first end of the at least one conductive member may include a mounting portion structured to be coupled to the line terminal. The at least one conductive member may be a pair of first and second conductive members wherein the first ends of the conductive members are connected together and the remainder of the conductive members are spaced apart to create a number of air gaps adapted to facilitate heat convection. The conductive members may each include as the plurality of bends, a first bend and a second bend. Between the first and second bends, the first conductive member may form a first angle with respect to the second conductive member in order to define a first air gap, and between the second bends and the second ends of the second conductive members, the first conductive member may form a second angle with respect to the second conductive member in order to define the second air gap. The second air gap may be larger than the first air gap.

In accordance with another aspect of the invention, the at least one conductive member may be a single conductive member including as the first end, the mounting portion. The mounting portion may be generally horizontal and may include first and second bends defining a pair of substantially vertical opposing flag portions. The single conductive member may further include a generally Z-shaped conductive portion disposed between the pair of substantially vertical opposing flag portions. Each of the substantially vertical opposing flag portions may have a surface area and include a plurality of flanges structured to increase the surface area. The single conductive member may have a first bend proximate the first end, a second intermediate bend, and third and fourth bends proximate the second end, wherein the first bend and the second intermediate bend generally define first and second substantially horizontal portions and a substantially vertical intermediate portion therebetween, and the third and fourth bends define a pair of opposing ear portions extending generally vertically from the second substantially horizontal portion. At least a portion of each conductive member may include a plurality of surface-enlarging mechanisms, such as the aforementioned flanges, which are structured to increase the surface area of the conductive member and thereby further facilitate heat removal. In addition to flanges, the surface-enlarging mechanisms may be selected from the group consisting of apertures, fins, and a combination of apertures, flanges and fins. The heat exchanger may also be made from a material having a high thermal conductivity, such as for example, copper, and at least a portion of the heat exchanger may be coated to have a dark color in order to further expel heat.

As another aspect of the invention, an electrical switching apparatus comprises: a housing; separable contacts enclosed within the housing; a line terminal in electrical communication with the separable contacts and accessible from the exterior of the housing; a current limiting element coupled to the line terminal; and a heat sink comprising: a heat exchanger including at least one conductive member having a first end, a second end, and a number of bends therebetween, the first end of the at least one conductive member being coupled to the line terminal at or about the current limiting element in order to dissipate heat.

The current limiting element may be generally cylindrical in shape and the at least one conductive member may be a pair of first and second conductive members having first and second air gaps wherein the second ends of the conductive members are disposed proximate the cylindrical current limiting element in order that the first and second air gaps promote convective air flow with respect to the cylindrical limiting element thereby further facilitating heat reduction. At least a portion of at least the second conductive member may abut the current limiting element in order to transfer heat away therefrom. The line terminal may include an electrical bus wherein the current limiting element is mechanically coupled to the electrical bus at a junction and the heat sink is mechanically coupled at or about the junction by a number of fasteners.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
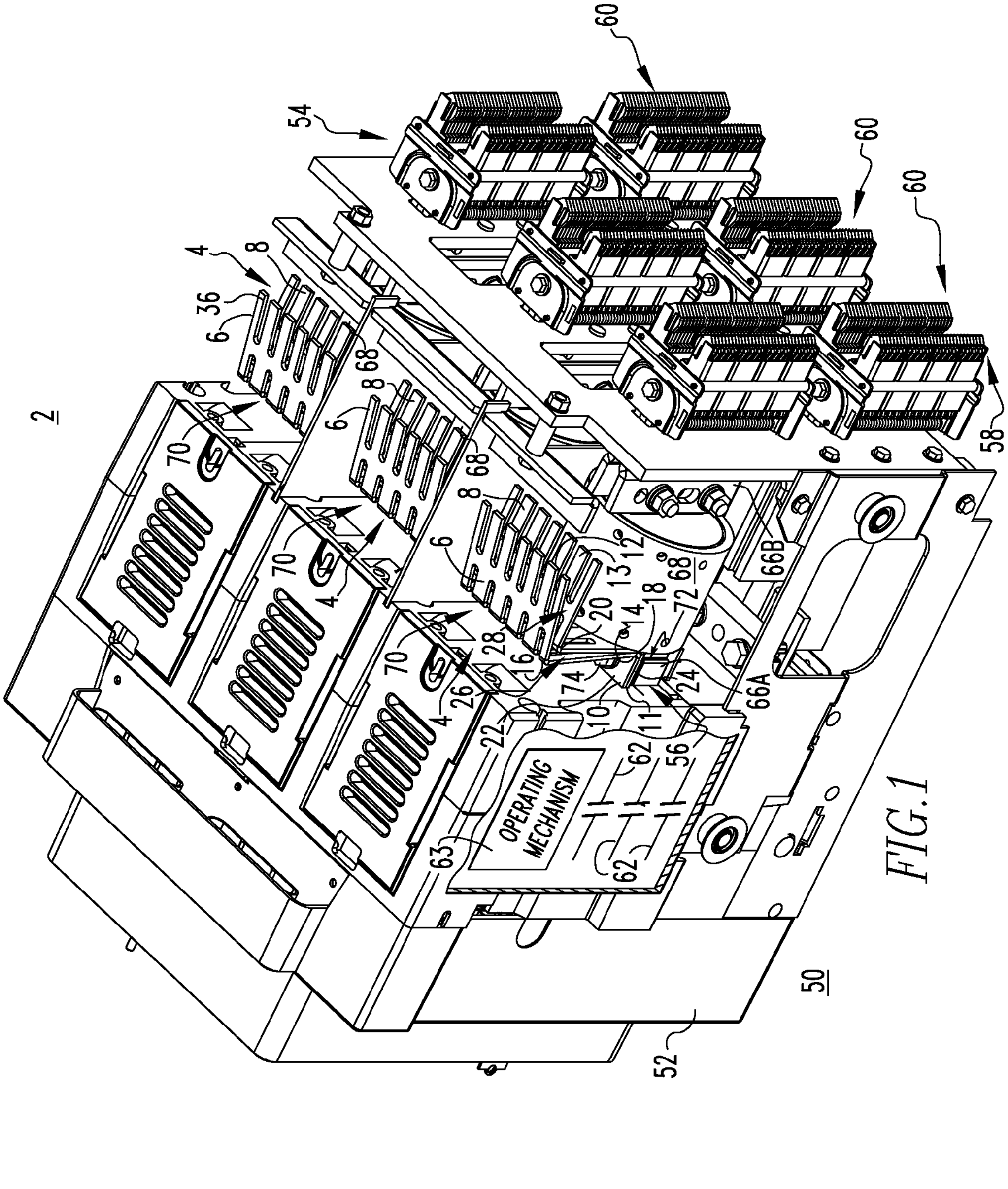
FIG. 1 is an isometric view of a three pole, integrally fused, low-voltage power air circuit breaker with each pole of the circuit breaker employing a heat sink in accordance with the invention.

For purposes of illustration, the invention will be described as applied to a three-pole integrally fused, low-voltage power air circuit breaker, although it will become apparent that it could also be applied to other types of electrical switching apparatus (e.g., without limitation, circuit switching devices and circuit interrupters such as other circuit breakers, contactors, motor starters, motor controllers and other load controllers) having one or more poles and tending to generate a thermal dam.

Directional phrases used herein, such as, for example, left, right, top, bottom, and derivatives thereof, relate to the orientation of the elements shown in the drawings and are not limiting upon the claims unless expressly recited therein.

As employed herein, the term “heat exchanger” refers to a temperature reducing mechanism consisting of one or more thermally conductive members.

As employed herein, the term “surface-enlarging mechanism” refers to any known or suitable mechanism for increasing the surface area of the conductive member in order to facilitate the dissipation of heat, expressly including, without limitation, perforations, slots or other apertures, flanges, fins, flat plates, coiled material and/or combinations thereof.

As employed herein, the phrase “high thermal conductivity” refers to any known or suitable material which facilitates rapid heat transfer, expressly including, without limitation, aluminum and copper, which, for example, at 20° C., have thermal conductivities of 237 and 390 W/mK, respectively.

As employed herein, the term “thermal dam” refers to any location, for example, on an electrical switching apparatus where there is a tendency to generate and/or stagnate heat.

As employed herein, the term “fastener” refers to any suitable connecting or tightening mechanism expressly including, but not limited to, screws, bolts and the combinations of bolts and nuts (e.g., without limitation, lock nuts) and bolts, washers and nuts.

As employed herein, the statement that two or more parts are “coupled” together shall mean that the parts are joined together either directly or joined through one or more intermediate parts.

As employed herein, the term “number” shall mean one or more than one (i.e., a plurality).

FIG. 1 shows three heat sinks 2 for use with a circuit breaker, such as an integrally fused, low-voltage power air circuit breaker 50. In the example of FIG. 1, the circuit breaker 50 includes a line side 54 having a plurality of line terminals 56, a load side 58 having a plurality of load terminals 60, separable contacts 62 electrically connected in series between the line side terminals 56 and the load side terminals 60 and operable between an open position and a closed position by way of an operating mechanism 63, and a housing 52 structured to enclose the separable contacts 62. The line terminals 56 are accessible from the exterior of the housing 52 and a current limiting element, such as the generally cylindrical current limiter 68, shown, is coupled to each line terminal 56, with electrical bus work 66A, 66B providing an electrically conductive pathway from the line terminals 56 to the current limiters 68 and beyond (see, e.g., bus work 66B), as shown. The electrical bus work 66A, the current limiters 68, and the line terminals 56, among other structures of the circuit breaker 50, contribute to the formation of a thermal dam 70 having a temperature. The three-pole integrally fused low-voltage power air circuit breaker 50 shown in FIG. 1 has three line terminals 56 (one is shown in FIG. 1) and three current limiters 68, resulting in the formation of three thermal dams 70. As previously discussed, heat generated at the thermal dams 70 can become excessive and may cause damage to the circuit breaker 50 and associated electrical equipment (not shown). To expel heat from the thermal dams 70 in order to reduce the temperature thereof, the heat sinks 2 in accordance with the present invention, may be employed as shown in FIG. 1.

Figure 2:
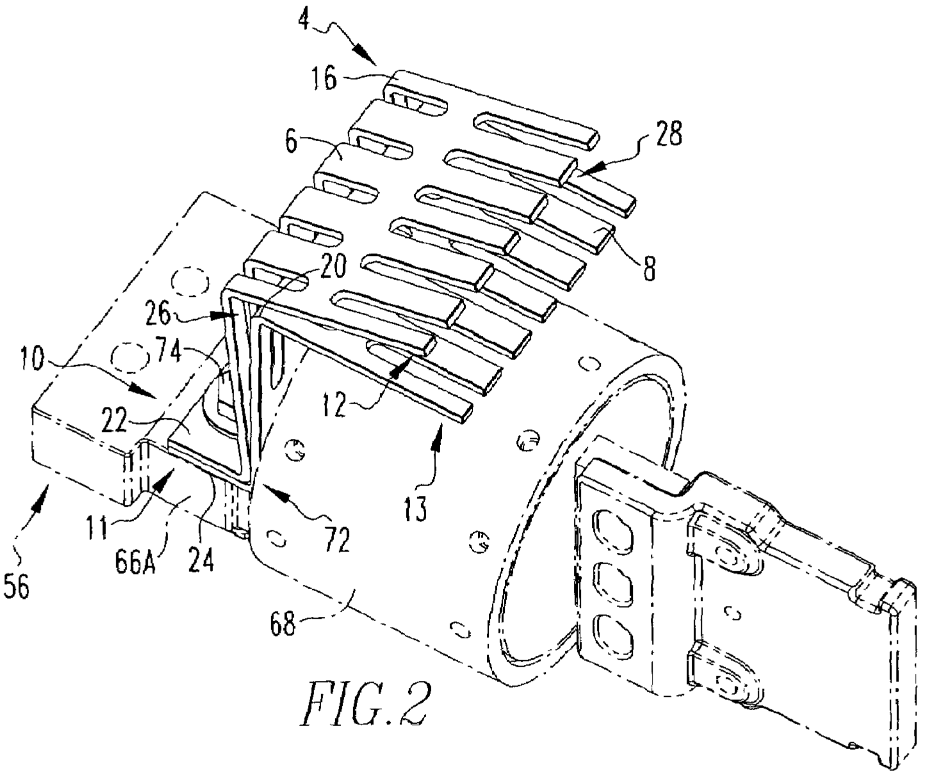
FIG. 2 is an isometric view of one line side termination including the heat sinks, current limiter assemblies and circuit breaker line side terminals of FIG. 1.
Figure 3:
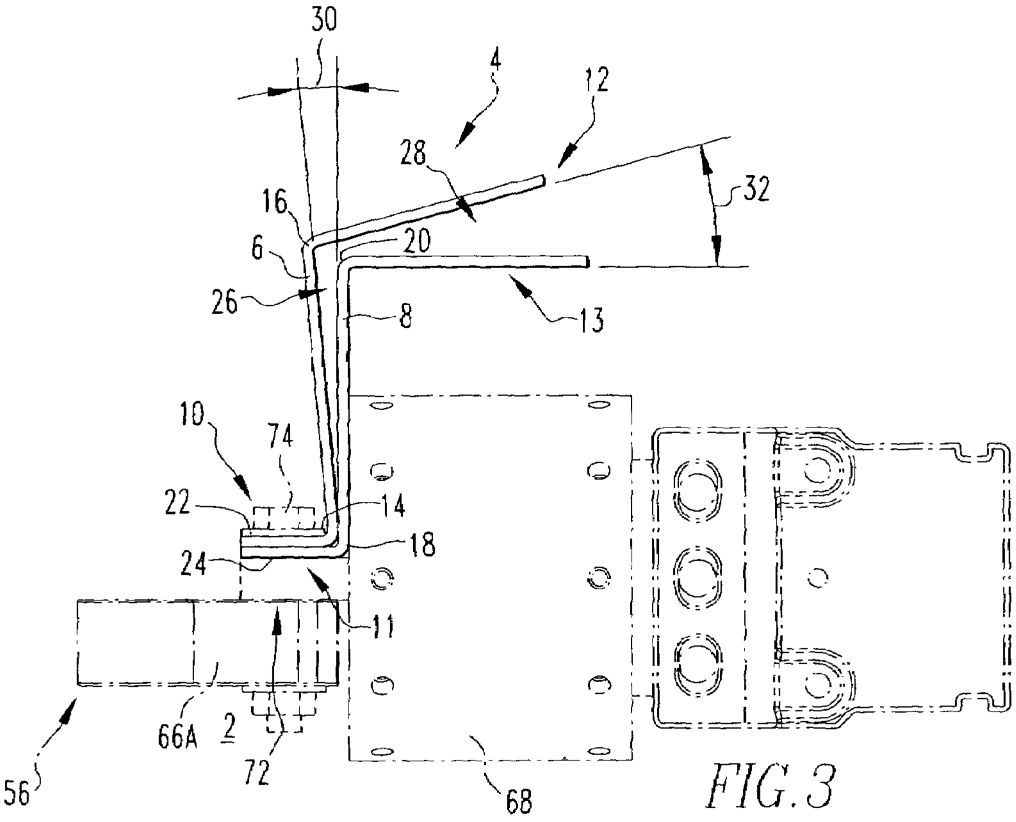
FIG. 3 is a vertical elevational view of the line side termination including heat sinks, current limiter assembly and circuit breaker line side terminals of FIG. 2.

Referring to FIGS. 1-3, the heat sink 2 includes a heat exchanger 4 structured to be coupled to the line terminal 56 at or about the current limiter 68 in order to facilitate the removal or transfer of heat away from the thermal dam 70. The heat exchanger 4 includes at least one conductive member 6, 8 having a first end 10, 11, a second end 12, 13, and a plurality of bends 14, 16, 18, 20 therebetween (as best shown in FIG. 3). In the example of FIGS. 1-3, the heat exchanger 4 comprises a pair of first and second conductive members 6, 8. The first ends 10, 11 of the first and second conductive members 6, 8 each include a mounting portion 22, 24, which is structured to be coupled to the line terminal 66A of circuit breaker 50. The first ends 10, 11 of the conductive members 6, 8 are connected together, while the remainder of the conductive members 6, 8 is spaced apart in order to create a number of air gaps 26, 28 which are adapted to facilitate heat convection.

More specifically, as best shown in FIG. 3, the first and second conductive members 6, 8 include a first bend 14, 18 and a second bend 16, 20, respectively. Between the first and second bends 14, 18, 16, 20, the first conductive member 6 forms a first angle 30 with respect to the second conductive member 8 in order to define the first air gap 26. Between the second bends 16, 20 and the second ends 12, 13 of the first and second conductive members 6, 8, the first conductive member 6 forms a second angle 32 with respect to the second conductive member 8, in order to define the second air gap 28 which is larger than the first air gap 26. The exact dimensions of the first and second air gaps 26, 28 and first and second angles 30, 32 thereof are not intended to be limiting upon the scope of the invention. As previously discussed, the air gaps (e.g., 26, 28) are intended to facilitate heat convection thereby drawing heat away from the current limiter 68 and the thermal dam 70 (FIG. 1). It will be appreciated that any known or suitable alternative heat exchanger configuration other than that shown and described herein, could be employed. For example, more than two conductive members having two or more air gaps could be employed without departing from the scope of the invention. Additionally, although the heat exchanger 4 is shown and described as having a first generally horizontal portion or mounting portion 22, 24, an intermediate generally vertical portion between first bends 14, 18 and second bends 16, 20, and a second generally horizontal portion which overlies the current limiter 68 in a spaced relationship (best shown in FIG. 3), the conductive members of the heat exchanger could be formed to have a wide variety of alternative configurations (see, for example, FIGS. 4-7 discussed hereinbelow).

Continuing to refer FIG. 3, at least a portion of the second conductive member 8 abuts the current limiter 68, in order to further facilitate heat transfer away therefrom. Such heat transfer is still further promoted through use of a material having a suitably high thermal conductivity, such as, for example, without limitation, copper. A copper-to-copper contact between, for example, the current limiter 68 and second conductive member 8, as well as between the first ends 10, 11 of the first and second conductive members 6, 8, further promotes rapid dissipation of heat from the thermal dam 70 (FIG. 1). In the example shown and described herein, the line terminal 56 includes electrical bus 66A and the current limiter 68 is electrically and mechanically coupled to the electrical bus 66A at a junction 72. The heat sink 2 is then mechanically coupled at or about the junction 72 of the electrical bus 66A and current limiter 68 by a number of fasteners, such as the bolts 74 shown in FIGS. 2-6. It will, however, be appreciated that the arrangement of the current limiter 68 or other suitable limiting element, electrical bussing 66A, 66B and junction 72 with heat sink 2 may be arranged in any suitable alternative configuration (not shown). For example, depending on the location of the thermal dam (e.g., 70), in the particular application, the heat sink (e.g., 2) could be positioned differently than the configuration shown, in order to expel heat from the thermal dam in a suitably efficient manner.

Figure 4:
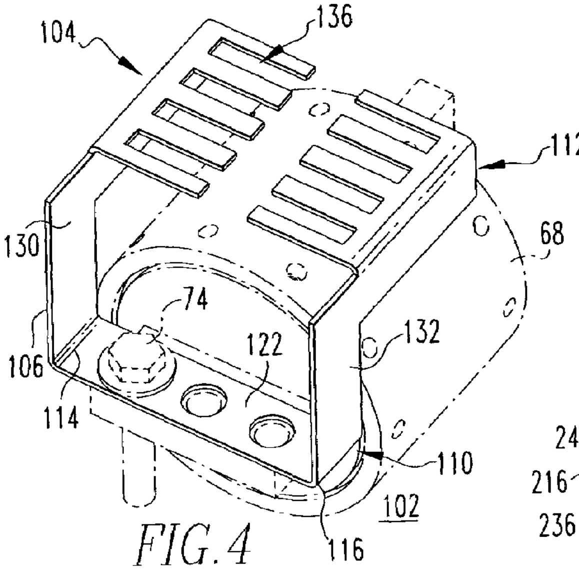
FIGS. 4-6 are isometric views of heat sinks in accordance with other embodiments of the invention, shown mounted on a current limiter.

FIG. 4 shows a heat sink 102 which comprises a single conductive member 106 having a first end 110 and a second end 112. The first end 110 includes a generally horizontal mounting portion 122. However, the mounting portion 122 further includes first and second bends 114, 116 in order to provide a pair of substantially vertical opposing flag portions 130, 132, as shown. As employed herein, the term "flag portion" refers to the generally flag-shaped configuration of the opposing portions 130, 132, which each have a generally vertical section somewhat like that of a flag pole and a generally rectangular lateral portion extending from the vertical section, somewhat like that of a flag. Another feature of the examples heat sink 2, 102, 202, 302, 402 is the use of one or more surface-enlarging mechanisms 36, 136, 236, 336, 436. For example, in the embodiment of FIG. 4, the opposing flag portions 130, 132 each have a surface area and include as the surface-enlarging mechanism 136, a plurality of slots or tab projections, as shown. It will be appreciated, however, that any known or suitable alternative surface-enlarging mechanism could be employed. For example, any suitable arrangement of holes, slots, or other apertures 236 (FIG. 5), flanges or fins 336 (FIG. 6), protrusions 436 (FIG. 7) and combinations thereof, could be employed.

Figure 5:
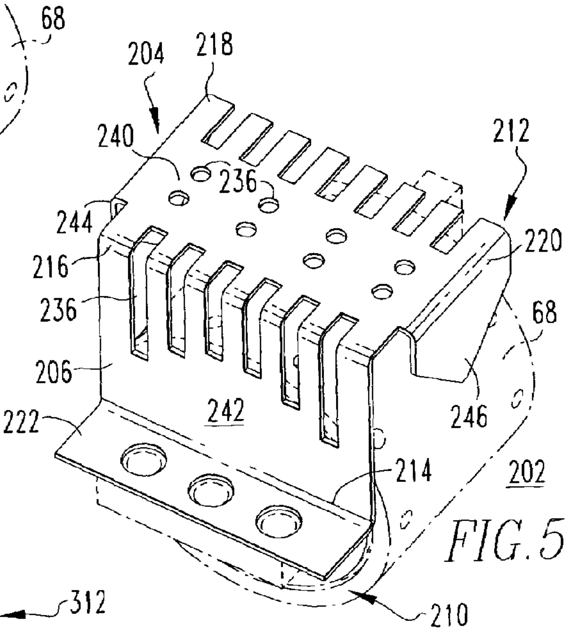

Referring to FIG. 5, another heat sink 202 comprises a heat exchanger 204 including one conductive member 206 having a first bend 214 defining the generally horizontal mounting portion 222 at first end 210, an intermediate substantially vertical portion 242, a second, intermediate bend 216 defining a second generally horizontal portion 240, and third and fourth bends 218, 220. The third and fourth bends 218, 220 are proximate the second end 212 of the conductive member 206, in order to define a pair of opposing ear portions 244, 246. The opposing ear portions 244, 246 extend generally vertically downward (from the perspective of FIG. 5) from the second horizontal portion 240, toward the current limiter 68, as shown.

Figure 6:
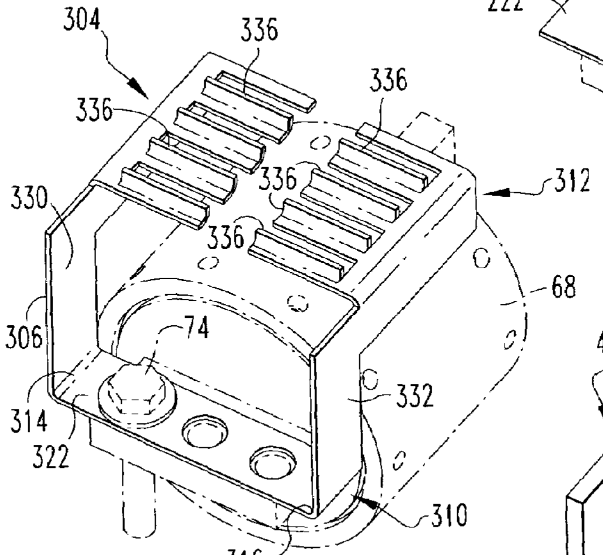

FIG. 6 shows another heat exchanger 304 comprising a single conductive member 306 having opposing flag portions 330, 332. The opposing flag portions 330, 332 each include a plurality of flanges 336 in order to enlarge the surface area of the heat sink 302 and further facilitate the rapid dissipation of heat.

Figure 7:
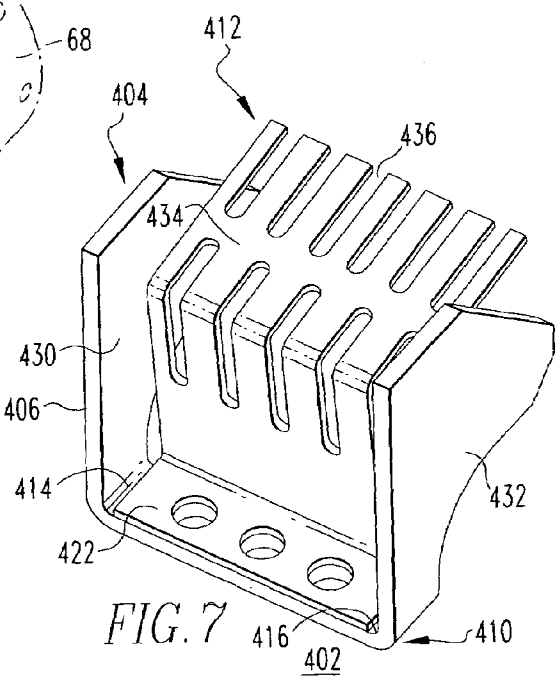
FIG. 7 is an isometric view of another heat sink in accordance with another embodiment of the invention.

Referring to FIG. 7, a heat sink 402 includes a conductive member 406 of a heat exchanger 404. The conductive member 406 includes a Z-shaped conductive portion 434 disposed between the pair of substantially vertical opposing flag portions 430, 432. Conductive portion 434 is Z-shaped because, in side elevational view (e.g., from the left side 430 of FIG. 7), the mounting portion 422 forms a substantially horizontal portion somewhat like the base of the letter Z, the top (from the perspective of FIG. 7) is also generally horizontal somewhat like the top of the letter Z, and the two horizontal portions are interconnected by a slanted relatively vertical portion somewhat like the letter Z.

In order to expel heat, the heat sink 402 and all of the other heat sinks 2, 102, 202, 302 previously discussed, can optionally be coated to have a dark color. For example, without limitation, the heat sinks 2, 102, 202, 302, 402 be painted black or dark grey, dark brown, dark blue, or dark green.

Accordingly, the invention provides a heat sink for rapidly and efficiently removing excess heat from a circuit breaker or other electrical switching apparatus at locations having a tendency to create a thermal dam, by using a suitably optimized combination of conductive materials, heat exchanger configurations including a number of air gaps, spacing and orientation, and the use of surface-enlarging mechanisms and other heat transfer devices. The heat exchanger provides relatively rapid heat reduction in order to, for example, expel heat from a thermal dam of a circuit breaker.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A heat sink for an electrical switching apparatus including electrical bus work and a limiting element, said electrical switching apparatus including a line side with line terminal means, a load side with load terminal means, separable contacts electrically connected in series between said line terminal means and said load terminal means, and a housing enclosing said separable contacts, at least said line terminal means being accessible from the exterior of said housing, said limiting element being coupled to said line terminal means, said electrical bus work, said limiting element, and said line terminal means of said electrical switching apparatus contribute to the formation of a thermal dam having a temperature, said heat sink comprising:

a heat exchanger structured to be coupled to said line terminal means proximate said limiting element, wherein said heat exchanger is structured to expel heat from said thermal dam in order to reduce the temperature thereof;

wherein said heat exchanger comprises at least one conductive member having a first end, a second end, and a plurality of bends therebetween, the first end of said at least one conductive member including a mounting portion structured to be coupled to said line terminal means;

wherein said at least one conductive member is a pair of first and second conductive members; and wherein the first ends of said first and second conductive members are connected together, the remainder of said first and second conductive members being spaced apart to create a number of air gaps adapted to facilitate heat convection; and wherein said number of air gaps includes a first air gap and a second air gap; wherein said first and second conductive members each include as said plurality of bends, a first bend and a second bend; wherein between said first and second bends, said first conductive member forms a first angle with respect to said second conductive member in order to define said first air gap; and wherein between said second bends and the second ends of said first and second conductive members, said first conductive member forms a second angle with respect to said second conductive member in order to define said second air gap, said second air gap being larger than said first air gap.

2. A heat sink for an electrical switching apparatus including electrical bus work and a limiting element, said electrical switching apparatus including a line side with line terminal means, a load side with load terminal means, separable contacts electrically connected in series between said line terminal means and said load terminal means, and a housing enclosing said separable contacts, at least said line terminal means being accessible from the exterior of said housing, said limiting element being coupled to said line terminal means, said electrical bus work, said limiting element, and said line terminal means of said electrical switching apparatus contribute to the formation of a thermal dam having a temperature, said heat sink comprising:

a heat exchanger structured to be coupled to said line terminal means proximate said limiting element, wherein said heat exchanger is structured to expel heat from said thermal dam in order to reduce the temperature thereof;

wherein said heat exchanger comprises at least one conductive member having a first end, a second end, and a plurality of bends therebetween, the first end of said at least one conductive member including a mounting portion structured to be coupled to said line terminal means; and wherein said at least one conductive member is a single conductive member including as the first end said mounting portion which is substantially horizontal; and wherein said substantially horizontal mounting portion includes first and second bends defining a pair of substantially vertical opposing flag portions.

3. The heat sink of claim 2 wherein said single conductive member further includes a substantially Z-shaped conductive portion disposed between said pair of substantially vertical opposing flag portions.

4. The heat sink of claim 2 wherein each of said substantially vertical opposing flag portions has a surface area; and wherein at least said opposing flag portions include a plurality of flanges structured to increase said surface area.

5. A heat sink for an electrical switching apparatus including electrical bus work and a limiting element, said electrical switching apparatus including a line side with line terminal means, a load side with load terminal means, separable contacts electrically connected in series between said line terminal means and said load terminal means, and a housing enclosing said separable contacts, at least said line terminal means being accessible from the exterior of said housing, said limiting element being coupled to said line terminal means, said electrical bus work, said limiting element, and said line terminal means of said electrical switching apparatus contribute to the formation of a thermal dam having a temperature, said heat sink comprising:

a heat exchanger structured to be coupled to said line terminal means proximate said limiting element, wherein said heat exchanger is structured to expel heat from said thermal dam in order to reduce the temperature thereof;

wherein said heat exchanger comprises at least one conductive member having a first end, a second end, and a plurality of bends therebetween, the first end of said at least one conductive member including a mounting portion structured to be coupled to said line terminal means; and wherein said at least one conductive member has a surface area;

wherein at least a portion of said at least one conductive member includes a plurality of surface-enlarging mechanisms structured to increase said surface area and further facilitate heat reduction; and wherein the second end of said at least one conductive member and at least some of said surface-enlarging mechanisms of said at least one conductive member are structured to overlay said limiting element.

6. The heat sink of claim 5 wherein said surface-enlarging mechanisms are selected from the group consisting of apertures, flanges, fins, and a combination of apertures, flanges and fins.

7. The heat sink of claim 5 wherein said limiting element is a current limiter; and wherein at least one of said at least one conductive member of said heat exchanger is structured to abut said current limiter in order to facilitate heat transfer away from said current limiter.

8. An electrical switching apparatus comprising:

a housing;

separable contacts enclosed within said housing;

a line terminal in electrical communication with said separable contacts and accessible from the exterior of said housing;

a limiting element coupled to said line terminal;

a heat sink comprising:

a heat exchanger including at least one conductive member having a first end, a second end, and a number of bends therebetween, the first end of said at least one conductive member being coupled to said line terminal at or about said limiting element in order to dissipate heat; and wherein said at least one conductive member is a pair of first and second conductive members; and wherein the first ends of said first and second conductive members are connected together, the remainder of said first and second conductive members being spaced apart to create at least one air gap for facilitating heat convection.

9. The electrical switching apparatus of claim 8 wherein said at least one air gap includes a first air gap and a second air gap; wherein said first and second conductive members each include as said number of bends, a first bend and a second bend; wherein between said first and second bends, said first conductive member forms a first angle with respect to said second conductive member in order to define said first air gap; and wherein between said second bends and the second ends of said first and second conductive members, said first conductive member forms a second angle with respect to said second conductive member in order to define said second air gap, said second air gap being different in size than said first air gap.

10. The electrical switching apparatus of claim 9 wherein said limiting element is substantially cylindrical in shape; and wherein the second ends of said first and second conductive members are disposed proximate said cylindrical limiting element in order that said first and second air gaps promote convective air flow with respect to said cylindrical limiting element and thereby further facilitating heat reduction.

11. The electrical switching apparatus of claim 8 wherein at least a portion of at least said second conductive member abuts said limiting element in order to transfer heat away therefrom.

12. An electrical switching apparatus comprising:

a housing;

separable contacts enclosed within said housing;

a line terminal in electrical communication with said separable contacts and accessible from the exterior of said housing;

a limiting element coupled to said line terminal;

a heat sink comprising:

a heat exchanger including at least one conductive member having a first end, a second end, and a number of bends therebetween, the first end of said at least one conductive member being coupled to said line terminal at or about said limiting element in order to dissipate heat; and wherein said at least one conductive member has a surface area;

wherein at least a portion of said at least one conductive member includes a plurality of surface-enlarging mechanisms adapted to increase said surface area; and wherein the second end of said at least one conductive member and at least some of said surface-enlarging mechanisms of said at least one conductive member overlay said limiting element.

13. The electrical switching apparatus of claim 12 wherein said limiting element is a current limiter; and wherein at least one of said at least one conductive member of said heat exchanger abuts said current limiter in order to facilitate heat transfer away from said current limiter.

14. An electrical switching apparatus comprising:

a housing;

separable contacts enclosed within said housing;

a line terminal in electrical communication with said separable contacts and accessible from the exterior of said housing;

a limiting element coupled to said line terminal;

a heat sink comprising:

a heat exchanger including at least one conductive member having a first end, a second end, and a number of bends therebetween, the first end of said at least one conductive member being coupled to said line terminal at or about said limiting element in order to dissipate heat; and wherein said line terminal includes an electrical bus; wherein said limiting element is mechanically coupled to said electrical bus at a junction; and wherein said heat sink is mechanically coupled proximate said junction of said electrical bus and said limiting element by a number of fasteners; and wherein the second end of said at least one conductive member and at least some of said surface-enlarging mechanisms of said at least one conductive member overlay said limiting element.

15. The electrical switching apparatus of claim 14 wherein said limiting element is a current limiter; and wherein at least one of said at least one conductive member of said heat exchanger abuts said current limiter in order to facilitate heat transfer away from said current limiter.

16. An electrical switching apparatus comprising:

a housing;

separable contacts enclosed within said housing;

a line terminal in electrical communication with said separable contacts and accessible from the exterior of said housing;

a limiting element coupled to said line terminal;

a heat sink comprising:

a heat exchanger including at least one conductive member having a first end, a second end, and a number of bends therebetween, the first end of said at least one conductive member being coupled to said line terminal at or about said limiting element in order to dissipate heat; and wherein said limiting element is a current limiter, and wherein said electrical switching apparatus is an integrally fused low-voltage power air circuit breaker.

* * * * *